United States Patent
Youn et al.

(10) Patent No.: US 7,501,881 B2
(45) Date of Patent: Mar. 10, 2009

(54) BOOSTING VOLTAGE GENERATING CIRCUIT FOR GENERATING A STABLE BOOSTING VOLTAGE UNDER A WIDER RANGE OF SUPPLY VOLTAGE AND SEMICONDUCTOR MEMORY DEVICE HAVING THE SAME

(75) Inventors: Jae Youn Youn, Seoul (KR); Han Na Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 26 days.

(21) Appl. No.: 11/707,001

(22) Filed: Feb. 16, 2007

(65) Prior Publication Data
US 2007/0222500 A1     Sep. 27, 2007

(30) Foreign Application Priority Data
Mar. 22, 2006    (KR) ................ 10-2006-0026174

(51) Int. Cl.
*G05F 1/10* (2006.01)
(52) U.S. Cl. ................................. 327/536
(58) Field of Classification Search ............ 327/74, 327/75, 536
See application file for complete search history.

(56) References Cited

U.S. PATENT DOCUMENTS

| 4,639,681 | A * | 1/1987 | Hasegawa | 327/166 |
| 6,285,622 | B1 * | 9/2001 | Haraguchi et al. | 365/226 |
| 6,628,555 | B2 * | 9/2003 | Kondo et al. | 365/189.09 |
| 6,765,428 | B2 * | 7/2004 | Kim et al. | 327/534 |
| 6,774,708 | B2 * | 8/2004 | Matsui | 327/536 |
| 7,091,769 | B2 * | 8/2006 | Kwon et al. | 327/535 |
| 7,274,248 | B2 * | 9/2007 | Okamoto | 327/536 |
| 7,312,649 | B2 * | 12/2007 | Origasa et al. | 327/536 |

FOREIGN PATENT DOCUMENTS

| JP | 10-356095 | 12/1998 |
| KR | 10-1996-0060518 | 11/1996 |
| KR | 10-2001-0073238 | 11/2001 |
| KR | 1020030002508 A | 1/2003 |
| KR | 2003-0042549 | 6/2003 |
| KR | 1020050005037 A | 1/2005 |
| KR | 1020050021643 A | 3/2005 |

* cited by examiner

*Primary Examiner*—Jeffrey S Zweizig
(74) *Attorney, Agent, or Firm*—Harness, Dickey & Pierce (57) ABSTRACT

The boosting voltage generating circuit of example embodiments may include a boosting level detection unit, a first boosting pump, and a second boosting pump. The boosting level detection unit may be configured to generate a target level detection signal and a margin level detection signal. The target level detection signal may have a logic state according to a level of a boosting voltage compared with a target voltage level, and the margin level detection signal may have a logic state according to a level of the boosting voltage compared with a margin voltage level, the margin voltage level being higher than the target voltage level. The first boosting pump may be controlled based on a target voltage level. The second boosting pump may be controlled based on a margin voltage level. According to the boosting voltage generating circuit of example embodiments, overshoot of the boosting voltage by the second boosting pump may remarkably decrease. Accordingly, the boosting voltage generating circuit of example embodiments may generate a stable boosting voltage under a wider range of supply voltage.

14 Claims, 6 Drawing Sheets

| | | $V_{PP} < V_{tag}$ | $V_{tag} \leq V_{PP} < V_{mag}$ | $V_{PP} \geq V_{mag}$ |
|---|---|---|---|---|
| conventional technology | first boosting pump | ON | OFF | OFF |
| | second boosting pump | ON | ON | ON |
| the present invention | first boosting pump | ON | OFF | OFF |
| | second boosting pump | ON | ON | OFF |

BOOSTING VOLTAGE GENERATING CIRCUIT FOR GENERATING A STABLE BOOSTING VOLTAGE UNDER A WIDER RANGE OF SUPPLY VOLTAGE AND SEMICONDUCTOR MEMORY DEVICE HAVING THE SAME

PRIORITY STATEMENT

This application claims the benefit of priority to Korean Patent Application No. 10-2006-0026174, filed on Mar. 22, 2006, in the Korean Intellectual Property Office, the entire contents of which is incorporated herein in its entirety by reference.

BACKGROUND

1. Field

Example Embodiments relate to an internal circuit of semiconductor memory device and, for example, to a boosting voltage generating circuit of a semiconductor memory device.

2. Description of Related Art

In a semiconductor memory device, a boosting voltage VPP may be used for preventing a voltage drop of a transferred signal. The boosting voltage VPP may be higher than an external supply voltage VCC. The supply voltage VCC may be used as an operation voltage in the semiconductor memory device. The boosting voltage VPP may be generated by pumping the supply voltage VCC. The boosting voltage generating circuit may be complemented in the semiconductor memory device. For example, the range of the supply voltage VCC may have a relatively wide scope, for example a scope of 1.5V to 3.8V. Accordingly, the boosting voltage generating circuit may be required to generate a stable boosting voltage VPP under a wider range of supply voltage VCC.

Figure 1:
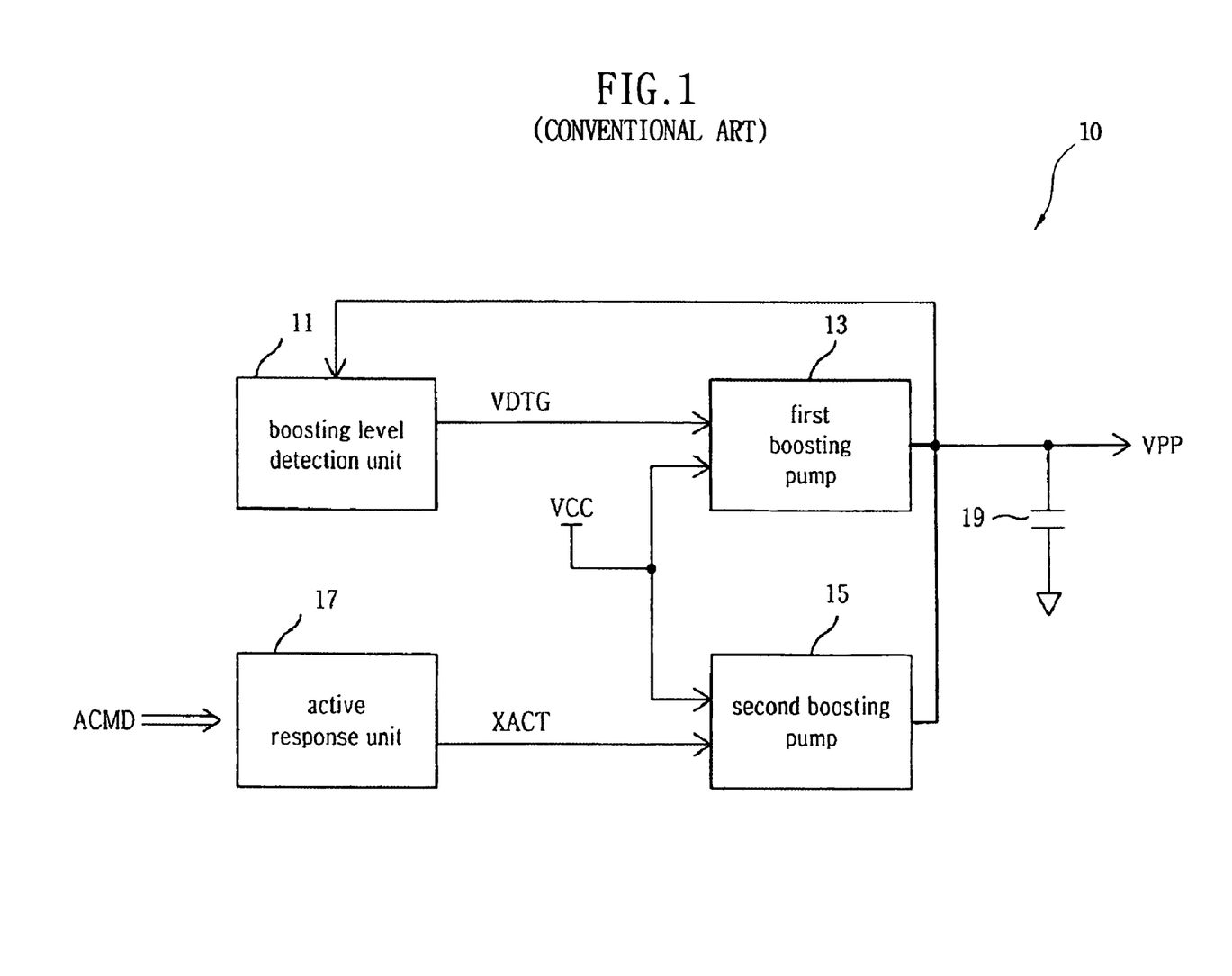
FIG. 1 is a drawing illustrating a conventional boosting voltage generating circuit 10.

FIG. 1 is a drawing illustrating a conventional boosting voltage generating circuit 10. In the boosting voltage generating circuit 10, a boosting level detection unit 11 may compare the boosting voltage VPP with a target voltage level Vtag(for example 3.6V) and may generate a target level detection signal VDTG. A first boosting pump 13 may pump the supply voltage VCC to increase the boosting voltage VPP depending on the logic state of the target level detection signal VDTG, for example, depending on the level of the boosting voltage VPP. A second boosting pump 15 may be controlled by an active control signal XACT that may be provided from an active response unit 17. The active control signal XACT may be activated in response to an active command ACMD. When the active command ACMD is generated, the semiconductor memory device may be operated in an active mode.

A bus including a modeling parasitic capacitor 19 may transfer the boosting voltage VPP.

The second boosting pump 15 may pump the supply voltage VCC to increase the boosting voltage VPP, regardless of the level of the pumping voltage in active operation. Accordingly, it may be very difficult to make the boosting voltage VPP stable.

For example, if the second boosting pump 15 is designed with lower pumping capacity, the supply capacity of the boosting voltage VPP may be lower when the supply voltage VCC is lower. Accordingly, when a semiconductor memory device is in the active mode, the level of the boosting voltage VPP may be decreased.

If the second boosting pump 15 is designed with higher pumping capacity, the boosting voltage VPP may be stable, if the supply voltage VCC is lower. However, there may be a problem that the boosting voltage VPP may overshoot a target voltage level when the supply voltage VCC is higher.

Accordingly, in the conventional boosting voltage generating circuit 10, it may be difficult to make the boosting voltage VPP stable.

SUMMARY

Example Embodiments may provide a boosting voltage generating circuit for generating a stable boosting voltage under a wider range of supply voltage and a semiconductor memory device having the same.

According to an example embodiment, a boosting voltage generating circuit may include an output configured to supply a boosting voltage, a first boosting pump configured to pump a supply voltage to generate a first pump voltage if a boosting voltage is less than a target voltage level and/or configured to supply the first pump voltage to the output, and/or a second boosting pump configured to pump the supply voltage to generate a second pump voltage if the boosting voltage is less than a margin voltage level and/or configured to supply the second pump voltage to the output. The margin voltage level may be higher than the target voltage level.

According to an example embodiment, a boosting voltage generating circuit may include an output configured to supply a boosting voltage, a first boosting pump configured to stop pumping a supply voltage to generate a first pump voltage if a boosting voltage reaches a target voltage level and/or configured to supply the first pump voltage to the output, and/or a second boosting pump configured to stop pumping the supply voltage to generate a second pump voltage if the boosting voltage reaches a margin voltage level and/or configured to supply the second pump voltage to the output. The margin voltage level may be higher than the target voltage level.

According to an example embodiment, a boosting voltage generating circuit may include a boosting level detection unit configured to generate a target level detection signal and a margin level detection signal, the target level detection signal having a logic state according to a level of a boosting voltage compared with a target voltage level, and/or the margin level detection signal having a logic state according to a level of the boosting voltage compared with a margin voltage level higher than the target voltage level; a first boosting pump configured to pump a supply voltage to increase the boosting voltage, the first boosting pump being controlled by the target level detection signal; and a second boosting pump configured to pump the supply voltage to increase the boosting voltage, the second boosting pump being controlled by the margin level detection signal.

According to an example embodiment, a method of operating a boosting voltage generating circuit may include stopping pumping of a first boosting pump if a boosting voltage reaches a target voltage level, stopping pumping of a second boosting pump if the boosting voltage reaches a margin voltage level, the margin voltage level being higher than the target voltage level, and/or outputting output from the first and second boosting pumps as the boosting voltage.

According to an example embodiment, a method of operating a boosting voltage generating circuit may include detecting a level of a boosting voltage, generating a target level detection signal if the detected level of the boosting voltage reaches a target voltage level, outputting the target level detection signal to a first boosting pump, generating a margin level detection signal if the detected level of the boosting voltage reaches a margin voltage level, the margin voltage level being higher than the target voltage level and outputting, and/or outputting the margin level detection signal to a second boosting pump.

According to an example embodiment, a method of operating a boosting voltage generating circuit may include enabling pumping of a first boosting pump if a boosting voltage is less than a target voltage level, enabling pumping of a second boosting pump if the boosting voltage is less than a margin voltage level, the margin voltage level being higher than the target voltage level, and/or outputting output from the first and second boosting pumps as the boosting voltage.

According to an example embodiment, a semiconductor memory device may include a memory array including a plurality of memory cells; at least one peripheral circuit being controlled to input/output data to/from at least one memory cell of the plurality of memory cells of the memory array; and the boosting voltage generating circuit. The boosting voltage generating circuit may be configured to supply the boosting voltage to the at least one peripheral circuit.

BRIEF DESCRIPTION OF THE DRAWINGS

The above and/or other aspects will become more apparent and more readily appreciated from the following detailed description of example embodiments taken in conjunction with the accompanying drawings of which.

DETAILED DESCRIPTION OF EXAMPLE EMBODIMENTS

Example embodiments will now be described in detail with reference to the attached drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
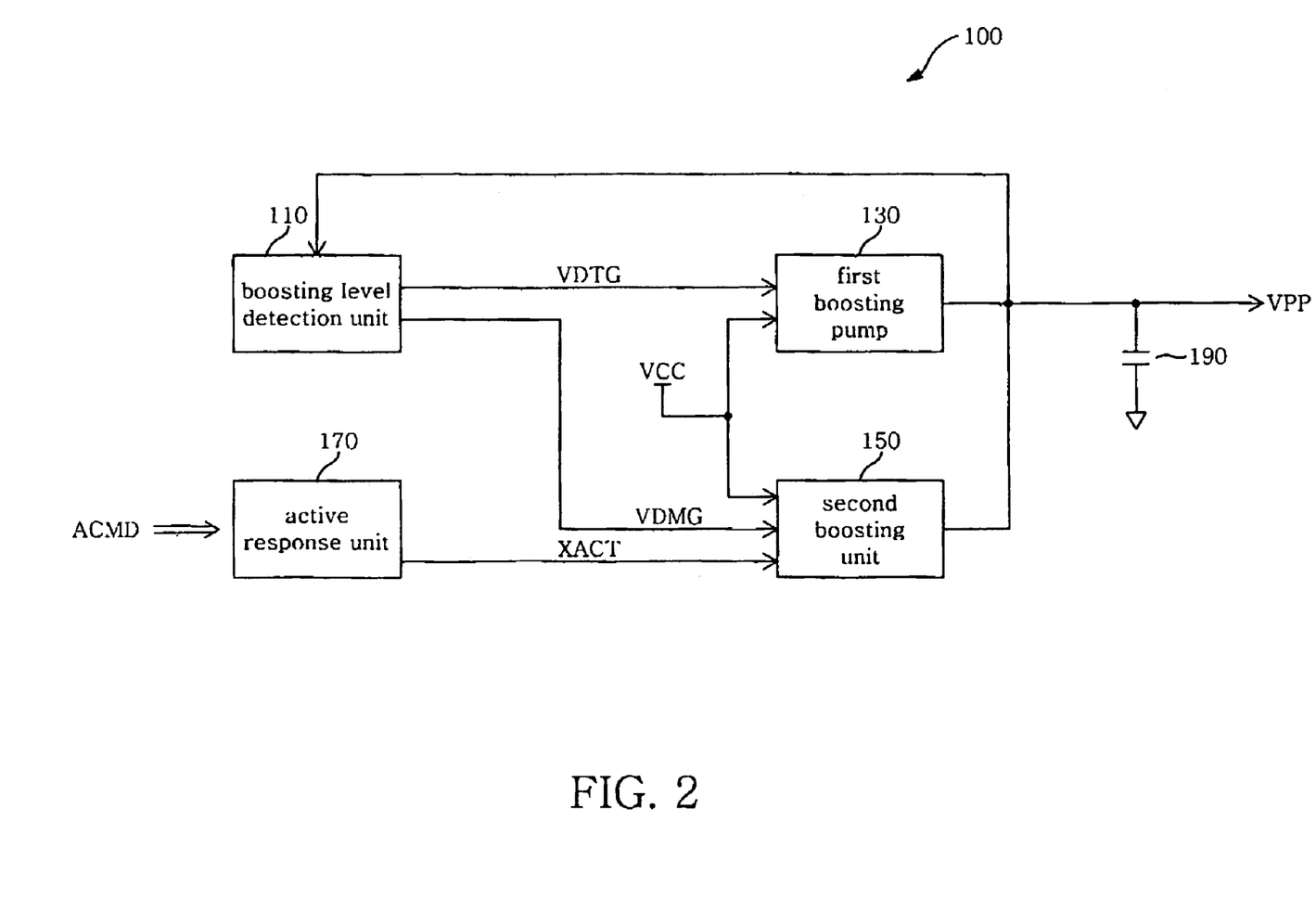
FIG. 2 is a drawing illustrating a boosting voltage generating circuit 100 according to an example embodiment.

FIG. 2 is a drawing illustrating a boosting voltage generating circuit 100 according to an example embodiment. The boosting voltage generating circuit 100 may pump a supply voltage VCC and may generate a boosting voltage VPP. The boosting voltage VPP may be higher than the supply voltage VCC.

Referring to FIG. 2, the boosting voltage generating circuit 100 may comprise a boosting level detection unit 110, a first boosting pump 130 and/or a second boosting pump 150.

The boosting level detection unit 110 may detect a level of the boosting voltage VPP and may generate a target level detection signal VDTG and/or a margin level detection signal VDMG. For example, the target level detection signal VDTG and/or the margin level detection signal VDMG may have a logic state according to the level of the boosting voltage VPP.

For example, the target level detection signal VDTG may have a logic state according to the level of the boosting voltage VPP compared with a target voltage level Vtag (for example 3.6V). For example, if the level of the boosting voltage VPP is lower than the target voltage level Vtag, the target level detection signal VDTG may be in a logic "Low" state. If the level of the boosting voltage VPP is higher than the target voltage level Vtag, the target level detection signal VDTG may be in a logic "High" state.

The margin level detection signal VDMG may have a logic state according to the level of the boosting voltage VPP compared with a margin voltage level Vmag (for example 3.9V). For example, the margin voltage level Vmag may be higher than the target voltage level Vtag. For example, if the level of the boosting voltage VPP is lower than the margin voltage level Vmag, the margin level detection signal VDMG may be in the logic "Low" state. If the level of the boosting voltage VPP is higher than the margin voltage level Vmag, the margin level detection signal VDMG may be in the logic "High" state.

Figure 3:
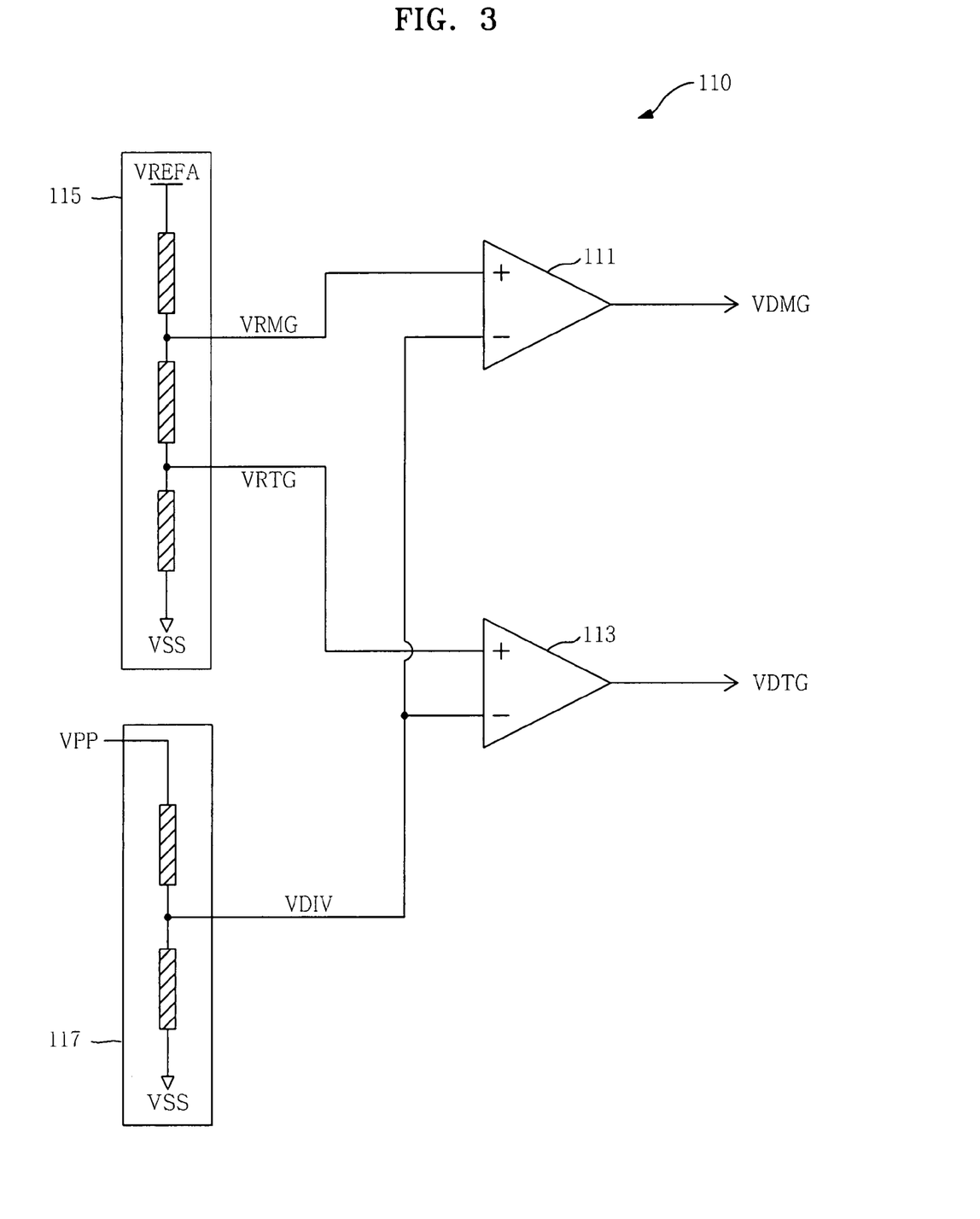
FIG. 3 is a detailed drawing illustrating the boosting level detection unit 110 of FIG. 2.

FIG. 3 is a detailed drawing illustrating the boosting level detection unit 110 of FIG. 2 according to an example embodiment. Referring to FIG. 3, the boosting level detection unit 110 may comprise a margin level comparator 111 and/or a target level comparator 113.

The margin level comparator 111 may generate the margin level detection signal VDMG by comparing the boosting voltage VPP with the margin voltage level Vmag. The target level comparator 113 may generate the target level detection signal VDTG by comparing the boosting voltage VPP with the target voltage level Vtag.

The boosting level detection unit 110 may further comprise a reference voltage generator 115 and/or voltage divider 117.

The reference voltage generator 115 may generate a margin reference voltage VRMG and a target reference voltage VRTG. The margin reference voltage VRMG and/or the target reference voltage VRTG may have a desired or predetermined voltage level regardless of the supply voltage VCC. The margin reference voltage VRMG and/or the target reference voltage VRTG may be generated by dividing a reference voltage VREFA.

The voltage divider 117 may generate a voltage divide signal VDIV by dividing the boosting voltage VPP. For example, the voltage level of the voltage divide signal VDIV may be controlled as the margin reference voltage VRMG when the level of the boosting voltage VPP reaches the margin voltage level Vmag. The voltage level of the voltage divide signal VDIV may be controlled as the target reference voltage VRTG when the level of the boosting voltage VPP reaches the target voltage level Vtag.

The margin level comparator 111 may generate the margin level detection signal VDMG by comparing the level of the voltage divide signal VDIV with the margin reference voltage VRMG. The target level comparator 113 may generate the target level detection signal VDTG by comparing the level of the voltage divide signal VDIV with the target reference voltage VRTG.

Returning to FIG. 2, the pumping of the first boosting pump 130 may be controlled by the level of the boosting voltage VPP compared with the target voltage level Vtag.

For example, if the target level detection signal VDTG is in the logic "Low" state, the first boosting pump 130 may be enabled for pumping. For example, if the level of the boosting voltage VPP is lower than the target voltage level Vtag, the first boosting pump 130 may increase the boosting voltage VPP by pumping the supply voltage VCC, for example according to a cycle of an operation signal(e.g. an oscillation signal).

If the target level detection signal VDTG is in the logic "High" state (e.g., the boosting voltage VPP is higher than the level of the target voltage level Vtag), the pumping of the first boosting pump 130 may be stopped. For example, regardless of the activation of an operation signal, the pumping of the first boosting pump 130 may be stopped. For example, the boosting voltage VPP may not be increased by the first boosting pump 130.

The pumping of the second boosting pump 150 may be controlled by the level of the boosting voltage VPP compared with the margin voltage level Vmag.

For example, if the margin level detection signal VDMG is in the logic "Low" state, the first boosting pump 150 may be enabled for pumping. For example, if the level of the boosting voltage VPP is lower than the margin voltage level Vmag, the second boosting pump 150 may increase the boosting voltage VPP by pumping the supply voltage VCC. If the margin level detection signal VDMG is in the logic "High" state (for example, the boosting voltage VPP is higher than the level of the margin voltage level Vmag), the pumping of the second boosting pump 150 may be stopped.

The second boosting pump 150 may become enabled in response to the active command ACMD. The term 'may become enabled' may mean that the boosting pump may execute the pumping operation in a certain condition.

The boosting voltage generating circuit of example embodiments may further comprise an active response unit 170. The active response unit 170 may provide the active control signal XACT to the second boosting pump 150. The active control signal XACT may be activated in response to the active command ACMD. The second boosting pump 150 may become enabled in response to the activation of the active control signal XACT.

A bus that may transfer the boosting voltage VPP may include a modeling parasitic capacitor 190.

Figure 4:
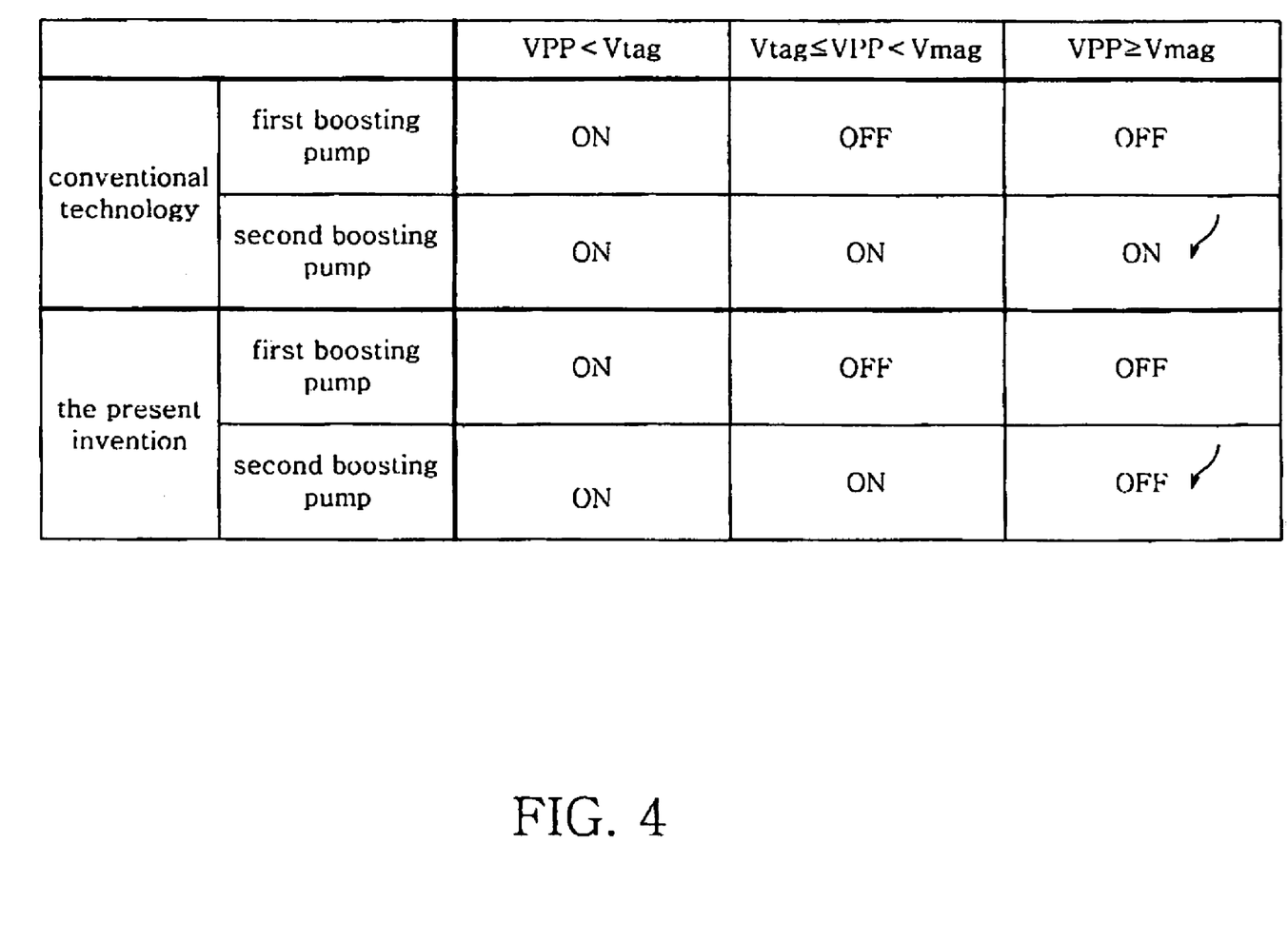
FIG. 4 is an example table illustrating the operating conditions of the first and the second boosting pump.

FIG. 4 is an example table illustrating the operating conditions of the first and the second boosting pump.

The operating conditions of the first boosting pump 130 (for example referring to FIG. 2) in example embodiments may be similar to that of the first boosting pump 13 (for example referring to FIG. 1) in the conventional art. For example, if the boosting voltage VPP is lower than the level of the target voltage level Vtag, the pumping operation of the first boosting pumps 13, 130 may be in an "ON" state. If the boosting voltage VPP is higher than the level of the target voltage level Vtag, the pumping operation of the first boosting pumps 13, 130 may be in an "OFF" state.

However, the operating conditions of the second boosting pump 150(for example referring to FIG. 2) in example embodiments may be different from that of the second boosting pump 15 (for example referring to FIG. 1) in the conventional art. The second boosting pump 15 in the conventional art is always in the "ON" state during the active mode. Accordingly, if the boosting voltage VPP is higher than the level of the margin voltage level Vmag, the second pump 15 may be in the "ON" state. However, the second boosting pump 150 in example embodiments is in the "OFF" state, if the boosting voltage VPP is higher than the level of the margin voltage level Vmag.

Figure 5:
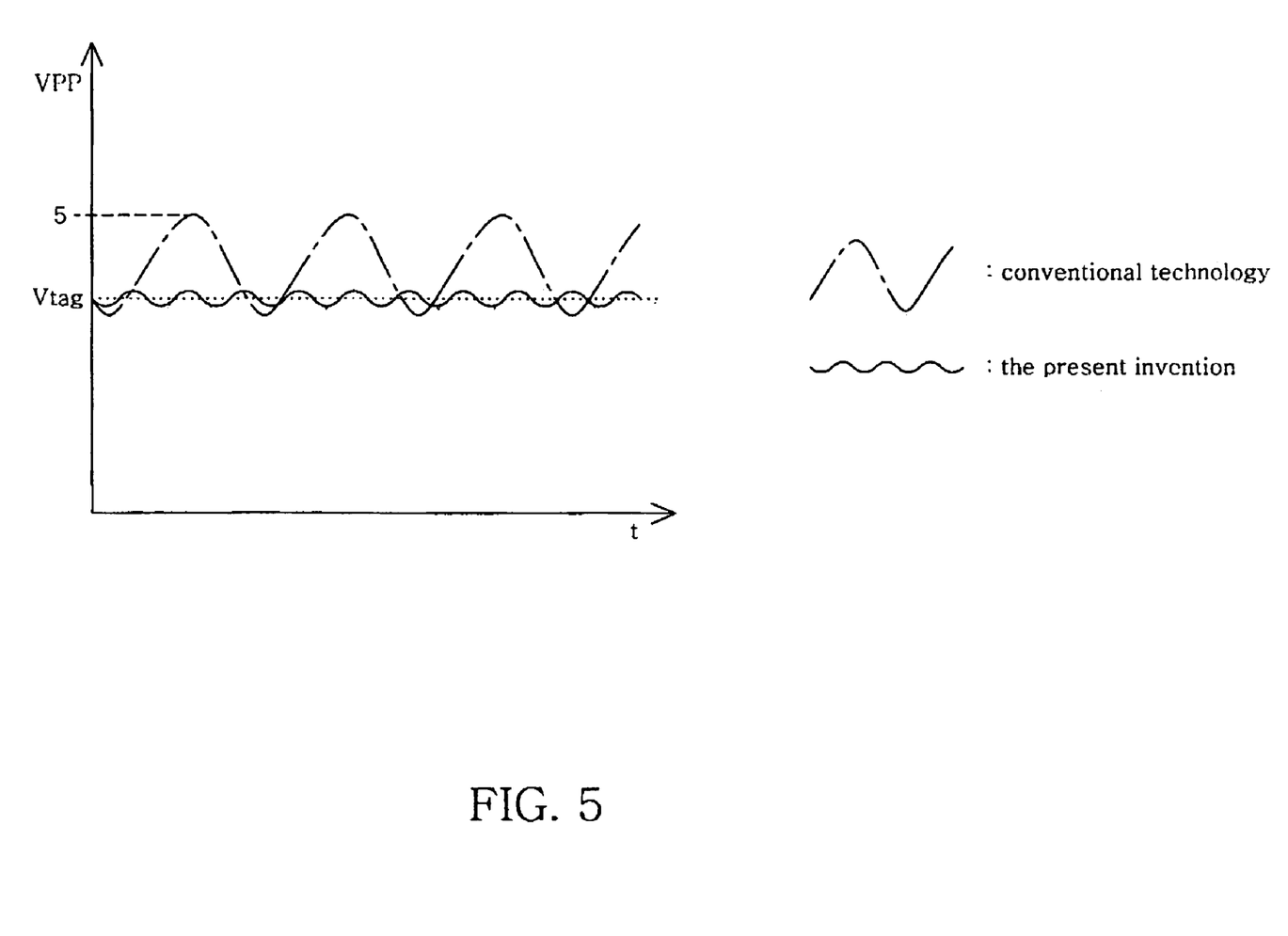
FIG. 5 is an example graph illustrating the overshoot of a boosting voltage VPP.

FIG. 5 shows that, in a boosting voltage generating circuit 100 according to example embodiments, the overshoot of the boosting voltage VPP by the second boosting pump 150 may be remarkably decreased. Accordingly, the boosting voltage VPP generated from the boosting voltage generating circuit 100 may be stable under a wider range of supply voltage VCC.

Figure 6:
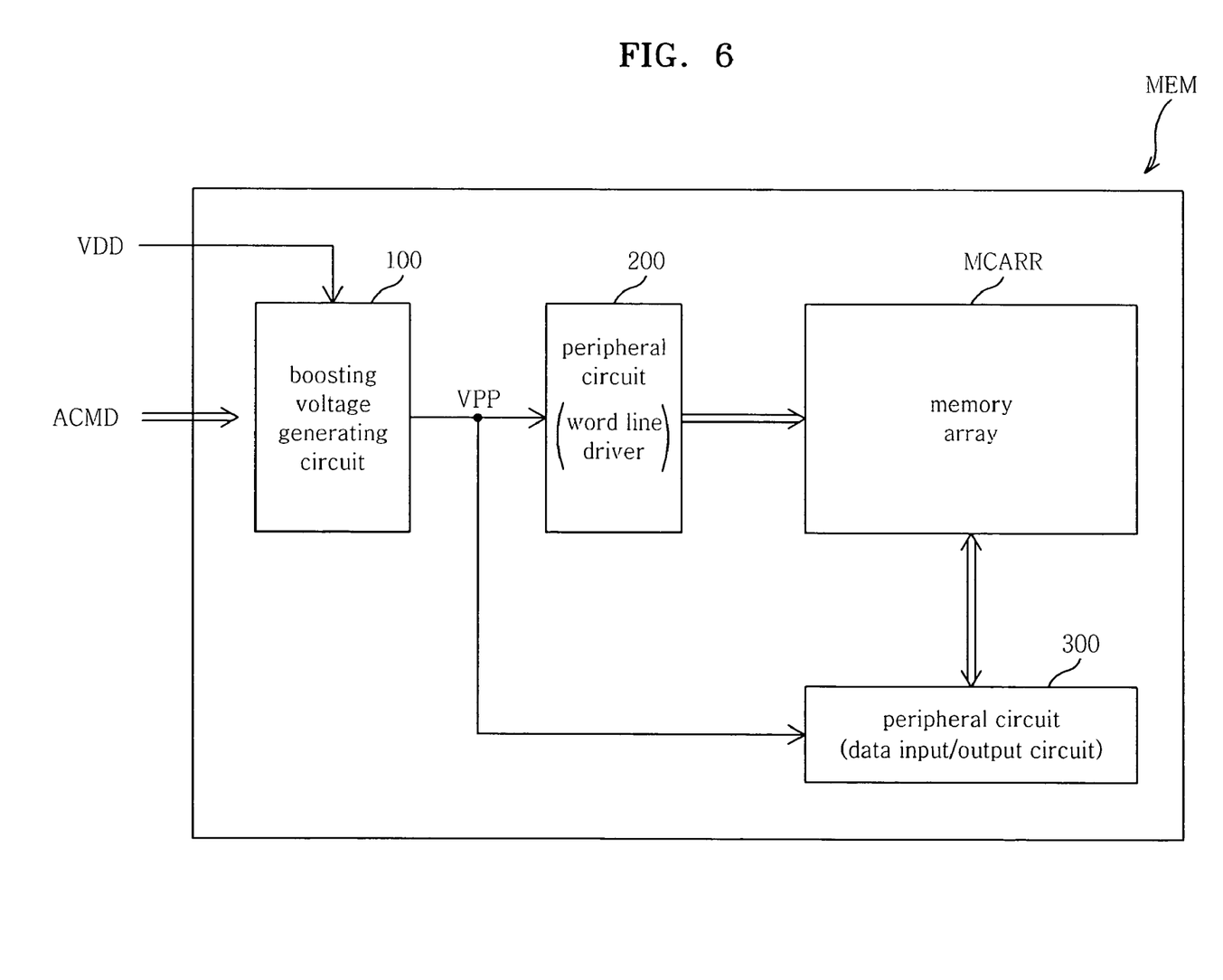
FIG. 6 is a drawing illustrating a semiconductor memory device MEM according to an example embodiment.

FIG. 6 is a drawing illustrating a semiconductor memory device MEM according to an example embodiment. Referring to FIG. 6, the semiconductor memory device MEM may include a memory array MCARR, a boosting voltage generating circuit 100 and/or at least one peripheral circuit 200, 300. The at least one peripheral circuit may be a peripheral circuit 200 and/or a peripheral circuit 300. The at least one peripheral circuit may be a single peripheral circuit including the elements of 200 and 300.

The memory array MCARR may include a plurality of memory cells(not shown). The boosting voltage generating circuit 100 may be as shown in FIG. 2. The boosting voltage generating circuit 100 may increase the boosting voltage VPP by pumping the supply voltage VCC, and may provide the boosting voltage VPP to the at least one peripheral circuit 200, 300.

The at least one peripheral circuit 200, 300 may include an internal circuit including a word line driver and/or a data input/output circuit. The at least one peripheral circuit 200, 300 may be controlled to input/output data to/from the memory cells of the data array MCARR.

In the boosting voltage generating circuit of example embodiments, overshoot of the boosting voltage by a second boosting pump may be remarkably decreased. Accordingly, the boosting voltage generating circuit of example embodiments may generate a stable boosting voltage VPP under a wider range of supply voltage VCC.

Although example embodiments have been shown and described in this specification and figures, it would be appreciated by those skilled in the art that changes may be made to the illustrated and/or described example embodiments without departing from their principles, spirit, and the scope of the invention.

What is claimed is:

1. A boosting voltage generating circuit, comprising:
    a boosting level detection unit configured to generate a target level detection signal and a margin level detection signal, the target level detection signal having a logic state according to a level of a boosting voltage compared with a target voltage level, and the margin level detection signal having a logic state according to a level of the boosting voltage compared with a margin voltage level, the margin voltage level being higher than the target voltage level;
    a first boosting pump configured to pump a supply voltage so as to increase the boosting voltage, the first boosting pump being controlled by the target level detection signal; and
    a second boosting pump configured to pump the supply voltage so as to increase the boosting voltage, the second boosting pump being controlled by the margin level detection signal,
    wherein the second boosting pump becomes enabled in response to an active command.

2. The boosting voltage generating circuit of claim 1, further comprising:
    an active response unit configured to provide an active control signal to the second boosting pump, wherein the active control signal is activated in response to the active command, and
    wherein the second boosting pump becomes enabled in response to an activation of the active control signal.

3. The boosting voltage generating circuit of claim 1, wherein the boosting level detection unit further comprises:
    a margin level comparator configured to compare the margin voltage level with the level of the boosting voltage and configured to generate the margin level detection signal; and
    a target level comparator configured to compare the target voltage level with the level of the boosting voltage and configured to generate the target level detection signal.

4. The boosting voltage generating circuit of claim 3, wherein the boosting level detection unit further comprises:
    a reference voltage generator configured to generate a margin reference voltage and a target reference voltage; and
    a voltage divider configured to divide the boosting voltage so as to generate a voltage divide signal,
    wherein the level of the voltage divide signal is controlled to have the margin reference voltage when the level of the boosting voltage corresponds to the margin voltage level, and
    wherein the level of the voltage divide signal is controlled to have the target reference voltage when the level of the boosting voltage corresponds to the target voltage level.

5. The boosting voltage generating circuit of claim 4, wherein each of the margin reference voltage and the target reference voltage are generated by dividing a reference voltage.

6. The boosting voltage generating circuit of claim 4, wherein
    the margin level comparator generates the margin level detection signal by comparing the margin reference voltage with the voltage divide signal, and
    the target level comparator generates the target level detection signal by comparing the target reference voltage with the voltage divide signal.

7. A method of operating a boosting voltage generating circuit, comprising:
    enabling a second boosting pump in response to an active coomand;
    stopping pumping of a first boosting pump if a boosting voltage reaches a target voltage level;
    stopping pumping of the second boosting pump if the boosting voltage reaches a margin voltage level, the margin voltage level being higher than the target voltage level; and
    outputting output from the first and second boosting pumps as the boosting voltage.

8. The method of claim 7, further comprising:
    providing an active control signal to the second boosting pump from an active response unit when the active control signal is activated in response to the active command; and
    enabling the second boosting pump in response to an activation of the active control signal.

9. The method of claim 7, further comprising:
    detecting if the boosting voltage reaches the target voltage level;
    detecting if the boosting voltage reaches the margin voltage level; and wherein
    the stopping pumping of the first boosting pump step stops pumping in response to the detecting of the boosting voltage reaching the target voltage level, and
    the stopping pumping of the second boosting pump step stops pumping in response to the detecting of the boosting voltage reaching the margin voltage level.

10. A method of operating a boosting voltage generating circuit, comprising:
    enabling a second boosting pump in response to an active command;
    detecting a level of a boosting voltage;
    generating a target level detection signal if the detected level of the boosting voltage reaches a target voltage level;
    outputting the target level detection signal to a first boosting pump;
    generating a margin level detection signal if the detected level of the boosting voltage reaches a margin voltage level, the margin voltage level being higher than the target voltage level; and
    outputting the margin level detection signal to the second boosting pump.

11. The method of claim 10, further comprising:
    pumping the first boosting pump to pump a supply voltage, the first boosting pump being controlled by the target level detection signal;

pumping the second boosting pump to pump the supply voltage, the second boosting pump being controlled by the margin level detection signal; and outputting output from the first and second boosting pumps as the boosting voltage.

12. A semiconductor memory device, comprising:

a memory array including a plurality of memory cells;

at least one peripheral circuit being controlled to input/output data to/from at least one memory cell of the plurality of memory cells of the memory array; and a boosting voltage generating circuit including a boosting level detection unit configured to generate a target level detection signal and a margin level detection signal, the target level detection signal having a logic state according to a level of a boosting voltage compared with a target voltage level, and the margin level detection signal having a logic state according to a level of the boosting voltage compared with a margin voltage level, the margin voltage level being higher than the target voltage level;

a first boosting pump configured to pump a supply voltage so as to increase the boosting voltage, the first boosting pump being controlled by the target level detection signal; and a second boosting pump configured to pump the supply voltage so as to increase the boosting voltage, the second boosting pump being controlled by the margin level detection signal, wherein the second boosting pump becomes enabled in response to an active command and the margin level detection signal, and the boosting voltage generating circuit is configured to supply the boosting voltage to the at least one peripheral circuit.

13. The semiconductor memory device of claim 12, wherein the pumping of the first boosting pump is stopped if the boosting voltage reaches the target voltage level; and wherein the pumping of the second boosting pump is stopped if the boosting voltage reaches the margin voltage level.

14. The semiconductor memory device of claim 12, further comprising:

an active response unit providing an active control signal to the second boosting pump, wherein the active control signal is activated in response to the active command, and wherein the second boosting pump becomes enabled in response to an activation of the active control signal.

* * * * *